United States Patent
Kosaka

(10) Patent No.: US 12,474,628 B2
(45) Date of Patent: Nov. 18, 2025

(54) REFLECTIVE MASK BLANK AND METHOD FOR MANUFACTURING REFLECTIVE MASK

(71) Applicant: Shin-Etsu Chemical Co., Ltd., Tokyo (JP)

(72) Inventor: Takuro Kosaka, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 456 days.

(21) Appl. No.: 17/716,938

(22) Filed: Apr. 8, 2022

(65) Prior Publication Data

US 2022/0350234 A1 Nov. 3, 2022

(30) Foreign Application Priority Data

Apr. 30, 2021 (JP) ................................. 2021-077133

(51) Int. Cl.
| | |
|---|---|
| G03F 1/24 | (2012.01) |
| G03F 1/48 | (2012.01) |
| G03F 1/52 | (2012.01) |
| G03F 1/60 | (2012.01) |
| G03F 1/68 | (2012.01) |

(52) U.S. Cl.
CPC .................. *G03F 1/24* (2013.01); *G03F 1/48* (2013.01); *G03F 1/52* (2013.01); *G03F 1/60* (2013.01); *G03F 1/68* (2013.01)

(58) Field of Classification Search
CPC .................................................. G03F 1/22–24
See application file for complete search history.

(56) References Cited

U.S. PATENT DOCUMENTS

| | | | |
|---|---|---|---|
| 2002/0045108 A1 | 4/2002 | Lee et al. | |
| 2006/0175616 A1 | 8/2006 | Chandhok | |
| 2007/0238033 A1* | 10/2007 | Kanayama | ................ G03F 1/24 428/428 |
| 2008/0316595 A1* | 12/2008 | Van Herpen | ........... B82Y 40/00 359/359 |

(Continued)

FOREIGN PATENT DOCUMENTS

| | | |
|---|---|---|
| JP | 2002122981 A | 4/2002 |
| JP | 2004342734 A * | 12/2004 |

(Continued)

OTHER PUBLICATIONS

Priority document JP 2021-114867 (no date).*
First Japanese Office Action for the corresponding Japanese Patent Application No. 2021-077133 issued by the Japanese Patent Office on Dec. 19, 2023 and its English Translation provided by foreign associate.

(Continued)

*Primary Examiner* — Martin J Angebranndt
(74) *Attorney, Agent, or Firm* — Ladas & Parry, LLP

(57) ABSTRACT

A reflective mask blank has a substrate 10; a multilayer reflective film 20 that is provided on the substrate 10 and reflects exposure light; a protective film 50 including a metal oxide film 51 provided on the multilayer reflective film 20; and an absorber film 70 that is provided on the protective film 50 and absorbs exposure light. The multilayer reflective film 20 is configured such that a Mo layer and a Si layer are alternately stacked and a layer on a side farthest from the substrate 10 is the Si layer. The metal oxide film 51 is configured such that an oxygen content in a layer on a side far from the substrate 10 is higher than the oxygen content in a layer on a substrate side.

9 Claims, 9 Drawing Sheets

(56) References Cited

U.S. PATENT DOCUMENTS

| | | |
|---|---|---|
| 2010/0136464 A1 | 6/2010 | Hosoya |
| 2010/0190113 A1 | 7/2010 | Murakami et al. |
| 2011/0070534 A1* | 3/2011 | Hayashi ................ B82Y 40/00 |
| | | 430/5 |
| 2012/0196208 A1* | 8/2012 | Mikami ............. G03F 7/70958 |
| | | 430/4 |
| 2013/0115547 A1 | 5/2013 | Mikami et al. |
| 2014/0186752 A1 | 7/2014 | Kinoshita et al. |
| 2014/0211178 A1* | 7/2014 | Ehm ................. G03F 7/70575 |
| | | 359/359 |
| 2015/0010854 A1* | 1/2015 | Seo ........................... G03F 1/24 |
| | | 430/5 |
| 2015/0037712 A1 | 2/2015 | Shih et al. |
| 2016/0011344 A1* | 1/2016 | Beasley .............. C23C 14/5853 |
| | | 427/160 |
| 2016/0238924 A1* | 8/2016 | Burkhardt ................ G03F 1/80 |
| 2017/0351169 A1* | 12/2017 | Yu ............................. G03F 1/24 |
| 2019/0384156 A1 | 12/2019 | Tanabe |
| 2021/0018828 A1 | 1/2021 | Lin |
| 2023/0161241 A1* | 5/2023 | Lee ........................... G03F 1/22 |
| | | 430/5 |
| 2024/0045318 A1* | 2/2024 | Lee .................... C23C 14/0641 |

FOREIGN PATENT DOCUMENTS

| | | | | |
|---|---|---|---|---|
| JP | 2004342867 A | * | 12/2004 | |
| JP | 2008041740 A | * | 2/2008 | |
| JP | 2010092947 A | | 4/2010 | |
| JP | 2014116498 A | | 6/2014 | |
| JP | 2014127630 A | | 7/2014 | |
| JP | 2017521711 A | | 8/2017 | |
| JP | 2018173664 A | * | 11/2018 | |
| JP | 2019219651 A | | 12/2019 | |
| KR | 20190126725 A | * | 11/2019 | ............... G03F 1/22 |
| TW | 202041964 A | * | 11/2020 | ............... G03F 1/58 |
| WO | 2008090988 A1 | | 7/2008 | |
| WO | WO-2023286669 A1 | * | 1/2023 | ............. C23C 14/06 |

OTHER PUBLICATIONS

"Evaluation of Alternative Capping Layers for EUVL Mask ML Blank," XP-002769817, Yan et al., Jan. 1, 2005, pp. 1-10.
Extended European Search Report for European Patent Application 22170688.0 issued on Oct. 4, 2022 by the European Patent Office.
Decision of Grant from corresponding Japanese Patent Application No. 2021-077133 dated Oct. 22, 2024, with its English translation.

* cited by examiner

REFLECTIVE MASK BLANK AND METHOD FOR MANUFACTURING REFLECTIVE MASK

TECHNICAL FIELD

The present invention relates to a reflective mask blank for manufacturing a reflective mask used, for example, for manufacturing a semiconductor device, and a method for manufacturing a reflective mask.

The present application claims the priority of Japanese Patent Application No. 2021-077133 filed on Apr. 30, 2021, the contents of which are entirely incorporated by reference.

BACKGROUND ART

In a process of manufacturing a semiconductor device, a photolithography technique of irradiating a transfer mask with exposure light and transferring a circuit pattern formed on the mask onto a semiconductor substrate (semiconductor wafer) by using a reduction projection optical system is repeatedly used. Conventionally, a wavelength of exposure light is mainly 193 nm using argon fluoride (ArF) excimer laser light, and a pattern having a dimension smaller than the exposure wavelength is finally formed by adopting a process called multi-patterning, which is plural combinations of an exposure process and a processing process.

However, it has become necessary to form finer patterns due to continuous miniaturization of device patterns, and therefore an Extreme Ultraviolet (hereinafter referred to as EUV) lithography technique using EUV light having a wavelength shorter than that of ArF excimer laser light has been used as exposure light. The EUV light is light having a wavelength of about 0.2 nm to 100 nm, more specifically, light having a wavelength of around 13.5 nm. This EUV light has extremely low transmittance to a substance, and a conventional transmission type projection optical system or mask cannot be used, and therefore a reflection type optical element is used. Therefore, a reflective mask has also been proposed as a mask for pattern transfer.

The reflective mask is configured such that a multilayer reflective film that reflects EUV light is provided on a substrate and an absorber film that absorbs EUV light is provided in a pattern on the multilayer reflective film. Meanwhile, a state before pattering of the absorber film (including a state in which a resist film has been formed) is called a reflective mask blank, and this is used as a material of the reflective mask (hereinafter, a reflective mask blank that reflects EUV light is also referred to as an EUV mask blank). The EUV mask blank has a basic structure including a multilayer reflective film that is provided on a glass substrate and reflects EUV light, and an absorber film that is provided on the multilayer reflective film and absorbs EUV light. As the multilayer reflective layer, a Mo/Si multilayer reflective film is typically used which ensures reflectance of EUV light by alternately stacking a molybdenum (Mo) layer and a silicon (Si) layer. As the absorber film, a material containing tantalum (Ta) having a relatively large value of an extinction coefficient with respect to EUV light as a main component is used.

A protective film for protecting the multilayer reflective film is provided between the multilayer reflective film and the absorber film. This protective film is intended to protect the multilayer reflective film so that the multilayer reflective film is not damaged by etching performed to form a pattern on the absorber film, pattern correction processing performed when a defect is detected after pattern formation, cleaning of a mask after mask pattern formation, and the like. As disclosed in Japanese Patent Application Publication No. 2002-122981, ruthenium (Ru) is used as the protective film.

SUMMARY OF INVENTION

Problem to be Solved by Invention

The reflective mask blank is typically formed by forming a protective film containing Ru as a main component on a multilayer reflective film (multilayer periodic film) in which a Mo layer and a Si layer are alternately stacked so that a topmost layer becomes Si, and performing heat treatment in a temperature zone of 120° C. to 200° C. in order to stabilize subsequent processes.

However, in a case where the protective film containing Ru and the multilayer reflective film having Si as a top layer is combined, reflectance tends to significantly decrease due to a RuSi diffusion layer formed by heat treatment. Although a configuration in which a Mo film or the like is formed as a buffer layer between the Ru film and the Si film may be employed in order to prevent formation of a diffusion layer by heat treatment at an interface between the Ru film and the Si film, the protective film is thin and therefore allows oxygen to easily pass therethrough, and therefore the buffer layer itself is oxidized, which may cause a large decrease in reflectance. If a metal oxide film having a high oxygen content is used as the protective film, a fluctuation in reflectance caused by heat treatment can be kept low, but there is a possibility that the top layer of the multilayer reflective film is oxidized more than necessary when the protective film is stacked, and reflectance may markedly decrease.

The present invention has been made in view of the above points, and provides a reflective mask blank that maintains high reflectance while keeping a decrease in reflectance small even in a case where heat treatment is performed, and a method for manufacturing the reflective mask blank.

Means for Solving Problem

[Concept 1]
A reflective mask blank according to the present invention may comprise:
  a substrate;
  a multilayer reflective film that is provided on the substrate and reflects exposure light;
  a protective film including a metal oxide film provided on the multilayer reflective film; and
  an absorber film that is provided on the protective film and absorbs exposure light, wherein
  the multilayer reflective film may be configured such that a Mo layer and a Si layer are alternately stacked and a layer on a side farthest from the substrate is the Si layer, and
  the metal oxide film may be configured such that an oxygen content in a layer on a side far from the substrate is higher than the oxygen content in a layer on a substrate side.

[Concept 2]
In the reflective mask blank according to concept 1, a metal contained in the metal oxide film may be a metal whose extinction coefficient k for EUV light having a wavelength of 13.53 nm is less than 0.02.

[Concept 3]
In the reflective mask blank according to concept 1 or 2, the protective film may function as an etching stopper while the absorber film is being processed.

[Concept 4]
In the reflective mask blank according to any one of concepts 1 to 3,
the metal oxide film may contain at least one of Zr, Nb, Ti, and Y.

[Concept 5]
In the reflective mask blank according to any one of concepts 1 to 4,
the oxygen content in the layer of the metal oxide film on the side far from the substrate may not change by heat treatment at 120° C. to 200° C.

[Concept 6]
In the reflective mask blank according to any one of concepts 1 to 5,
a thickness of the metal oxide film may be 0.5 nm or more and less than 3.5 nm.

[Concept 7]
In the reflective mask blank according to any one of concepts 1 to 6,
the metal oxide film may have a multilayer structure and is configured such that an oxygen content in a second layer located on the side far from the substrate is higher than an oxygen content in a first layer located on the substrate side.

[Concept 8]
In the reflective mask blank according to any one of concepts 1 to 7,
the oxygen content in the metal oxide film may continuously increase as a distance from the substrate increases.

[Concept 9]
In the reflective mask blank according to any one of concepts 1 to 8,
the Si layer of the multilayer reflective film on a side farthest from the substrate may contain a light element other than oxygen on a metal oxide film side.

[Concept 10]
The reflective mask blank according to any one of concepts 1 to 9 may further comprise
an oxidation inhibition layer between the Si layer of the multilayer reflective film on a side farthest from the substrate and the metal oxide film, the oxidation inhibition layer containing a light element other than oxygen on a metal oxide film side, wherein
a thickness of the oxidation inhibition layer may be 0.2 nm or more and 3 nm or less.

[Concept 11]
In the reflective mask blank according to concept 9 or 10, the light element may be one or more of nitrogen, carbon, and boron.

[Concept 12]
In the reflective mask blank according to any one of concepts 1 to 11,
in a case where first reflectance with respect to EUV light having a wavelength of 13.53 nm before heat treatment at 120° C. to 200° C. and second reflectance with respect to the EUV light having a wavelength of 13.53 nm after the heat treatment at 120° C. to 200° C. are compared, a change of the second reflectance with respect to the first reflectance may be 0.5% or less.

[Concept 13]
A method for manufacturing a reflective mask according to the present invention may comprise manufacturing a reflective mask by using the reflective mask blank according to any one of concepts 1 to 12.

According to an aspect of the present invention, a reflective mask blank that maintains high reflectance while keeping a decrease in reflectance small even in a case where heat treatment is performed.

DETAILED DESCRIPTION

Figure 1A:
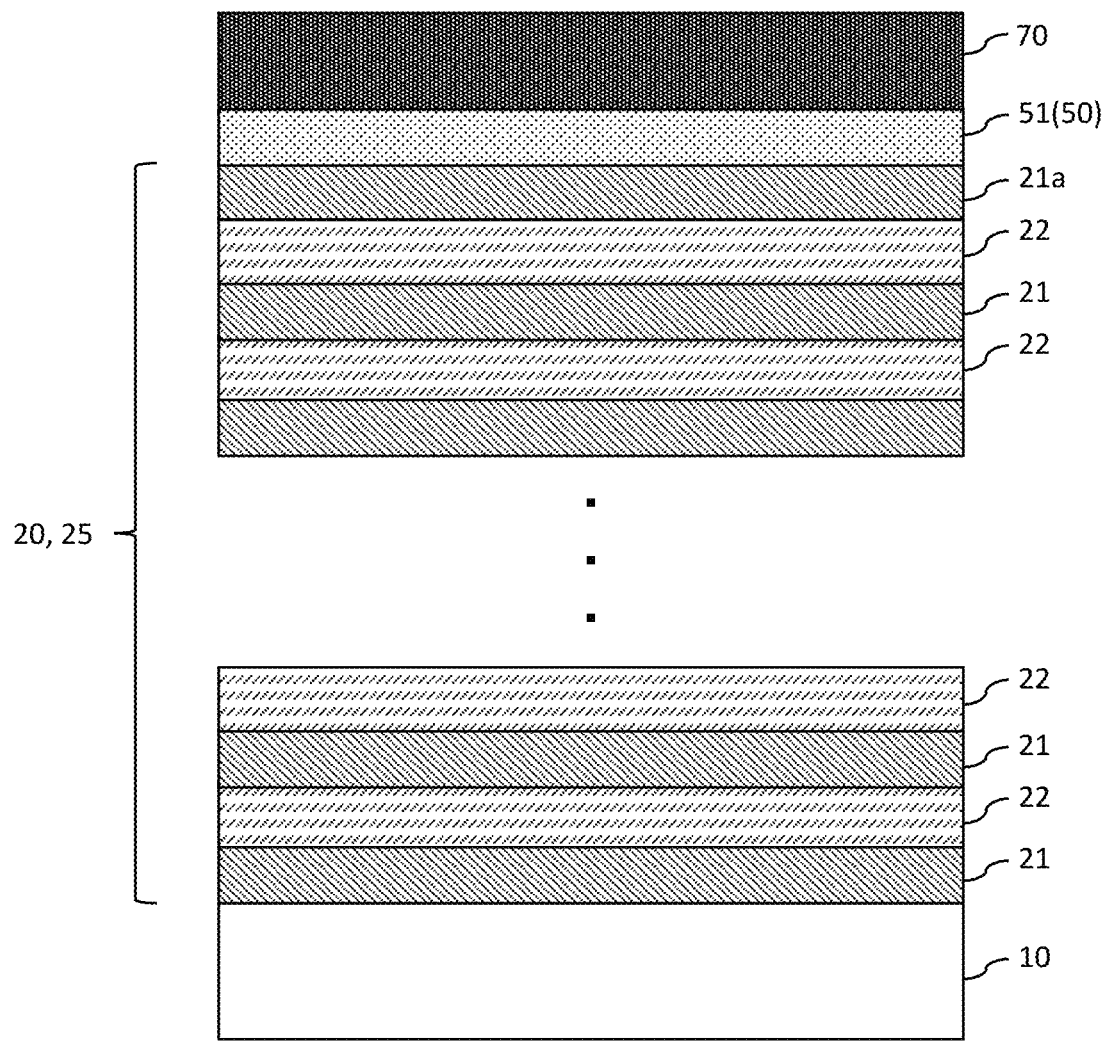
FIG. 1A is a cross-sectional view illustrating an example of a reflective mask blank according to an embodiment of the present invention.
Figure 1B:
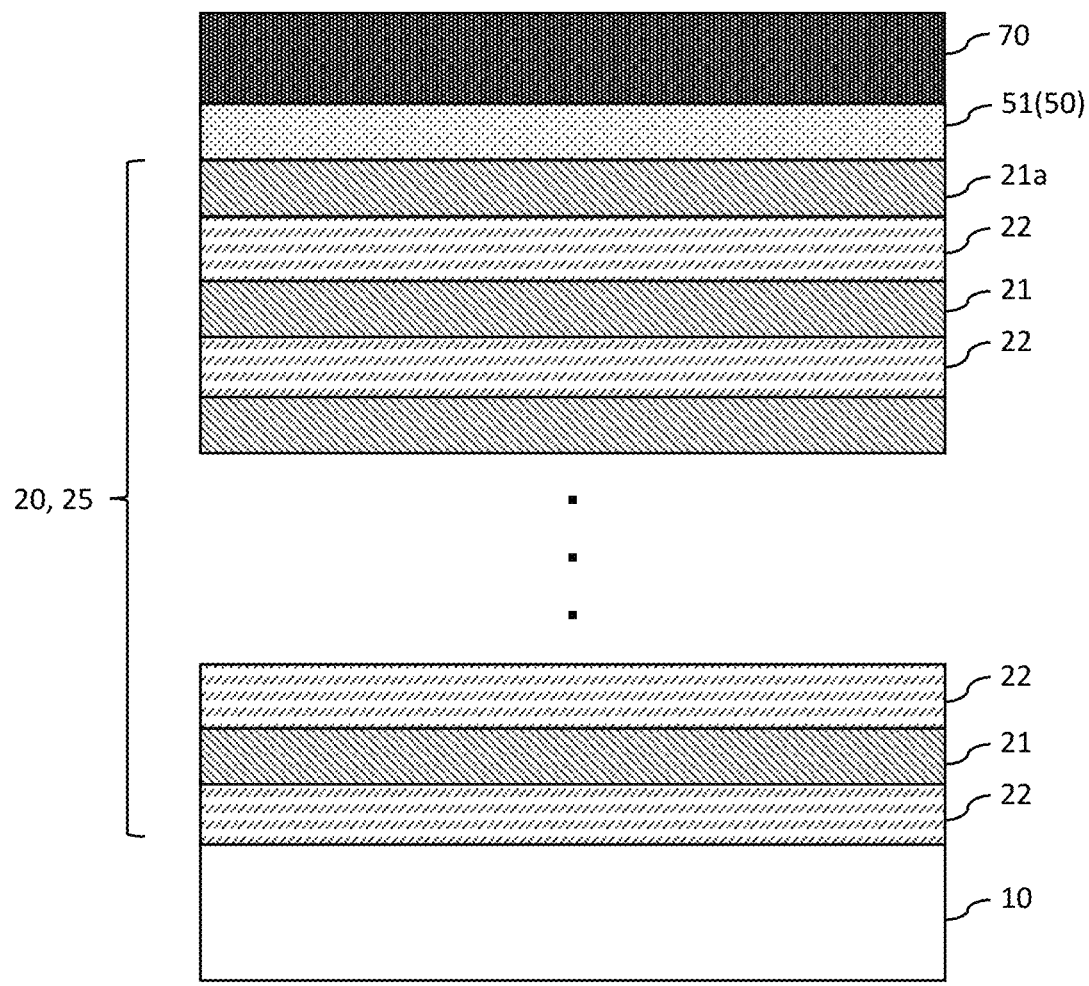
FIG. 1B is a cross-sectional view illustrating another example of a reflective mask blank according to the embodiment of the present invention.

Hereinafter, the present invention will be described.
As illustrated in FIGS. 1A and 1B, an EUV mask blank according to the present embodiment includes a substrate 10 made of glass or the like, and a multilayer reflective film 20 that is provided on the substrate 10 (on one main surface, in this aspect, on a front surface) and reflects exposure light, specifically, a multilayer reflective film 20 that reflects EUV light. The multilayer reflective film 20 may be provided in contact with one main surface of the substrate 10. A wavelength of EUV light used for EUV lithography using EUV light as exposure light is 13 nm to 14 nm, typically, about 13.5 nm (for example, 13.4 nm to 13.6 nm).

The substrate 10 preferably has low thermal expansion characteristics for EUV light exposure, and for example, is preferably formed of a material having a thermal expansion coefficient within a range of $\pm 2 \times 10^{-8}/°$ C., preferably $\pm 5 \times 10^{-9}/°$ C. Furthermore, the substrate 10 preferably has a surface that is sufficiently planarized, and surface roughness of the main surface of the substrate 10 is preferably 0.5 nm or less, particularly 0.2 nm or less in RMS value. Such surface roughness can be obtained, for example, by polishing the substrate 10.

The multilayer reflective film 20 is a multilayer film in which a low refractive index material and a high refractive index material are alternately stacked, and is a film that reflects EUV light that is exposure light. In the present embodiment, the multilayer reflective film 20 has a Si/Mo stacking part 25 constituted by a Si (silicon) layer 21 and a Mo (molybdenum) layer 22 that are alternately stacked to form multiple layers. As the Si/Mo stacking part 25, one in which a layer of Si (Si layer 21), which is a material having a relatively high refractive index with respect to EUV light, and a layer of Mo (Mo layer 22), which is a material having a relatively low refractive index with respect to EUV light, are periodically stacked is used. The Si layer 21 and the Mo layer 22 may be a layer made of silicon alone and a layer made of molybdenum alone, respectively, or may contain other components in an amount of less than 10%. The number of stacked Si layers 21 and Mo layers 22 is, for example, preferably 40 cycles or more (40 layers or more for each), and preferably 60 cycles or less (60 layers or less for each). Thicknesses of the Si layer 21 and the Mo layer 22 of the Si/Mo stacking part 25 are appropriately set according to the exposure wavelength, and the thickness of the Si layer 21 is preferably 5 nm or less, and the thickness of the Mo layer 22 is preferably 4 nm or less. A lower limit of the thickness of the Si layer 21 is not limited in particular, but is typically 1 nm or more. A lower limit of the thickness of the Mo layer 22 is not limited in particular, but is typically 1 nm or more. The thicknesses of the Si layer 21 and the Mo layer 22 may be set so that high reflectance is obtained for EUV light. The Si layer 21 and the Mo layer 22 may have constant thicknesses or may have thicknesses that differ from one layer to another. The entire thickness of the Si/Mo stacking part 25 is typically about 250 nm to 450 nm.

The inventors of the present application found that film oxidation of a protective film 50 can be prevented by increasing an oxygen content on a side of the protective film 50 far from the multilayer reflective film 20, and furthermore, oxidation of the multilayer reflective film 20 by heat can be prevented by decreasing an oxygen content in a layer of the protective film 50 that makes contact with the surface layer Si of the multilayer reflective film 20, and thereby it is possible to manufacture a reflective mask blank that maintains high reflectance while keeping a decrease in reflectance small even when heat treatment at 120° C. to 200° C. is performed after formation of the multilayer reflective film 20, and accomplished the present invention. It has also been confirmed that the protective film 50 is particularly preferably made of a metal oxide film 51, such as Zr, Nb, Ti, or Y, whose extinction coefficient k for EUV light (13.53 nm) is 0.02 or less.

Figure 2:
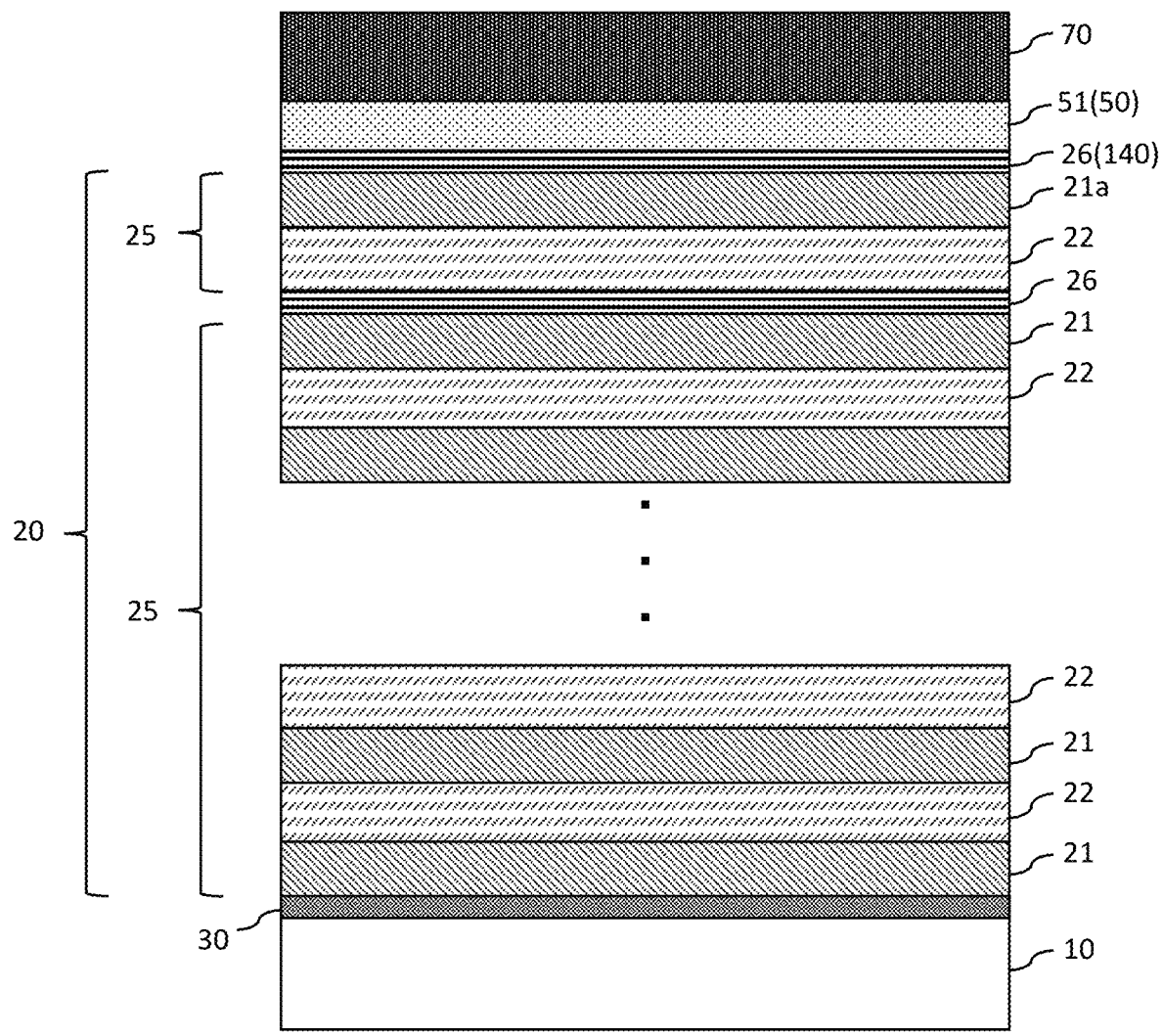
FIG. 2 is a cross-sectional view illustrating an example of a reflective mask blank containing an SiN-containing layer according to the embodiment of the present invention.

In the present embodiment, the Si/Mo stacking part 25 may be configured such that a layer containing Si and N is provided in contact with both the Si layer 21 and the Mo layer 22 at any one or more parts between the Si layer 21 and the Mo layer 22. The layer containing Si and N preferably does not contain oxygen. Specifically, a SiN (SiN means that being made of Si and N only) layer (SiN-containing layer 26) is suitable as the layer containing Si and N (see FIG. 2). The content of N in the layer containing Si and N is preferably 1 at % or more, particularly preferably 5 at % or more, and is preferably 60 at % or less, particularly preferably 57 at % or less. A thickness of the layer containing Si and N is preferably 2 nm or less, and more preferably 1 nm or less. A lower limit of the thickness of the layer containing Si and N is not limited in particular, but is preferably 0.1 nm or more.

In the present embodiment, a layer of the multilayer reflective film 20 on a side farthest from the substrate 10 is the Si layer 21. The protective film 50 provided on this Si layer 21 may be the metal oxide film 51 made of a metal whose extinction coefficient k for EUV light (13.53 nm) is less than 0.02. By using a metal having an extinction coefficient k of less than 0.02 for the protective film, reduction in reflectance due to formation of the protective film can be suppressed. The protective film 50 may include a film (for example, a metal film or a resin film) other than the metal oxide film 51. An oxygen content may vary in the metal oxide film 51. In the metal oxide film 51, an oxygen content of a layer on a side far from the substrate 10 may be higher than that on the substrate 10 side. The metal oxide film 51 may contain any one or more of elements Zr, Nb, Ti, and Y. By adopting such an aspect, a high reflectance can be obtained, and an etching speed of etching of an absorber film 70 on a side far from the substrate 10 can be further reduced. Therefore, the protective film 50 functions as an etching stopper during processing of the absorber film 70.

An oxygen content of a layer (a farthest Si layer 21a, which is typically the Si layer 21 farthest from the substrate 10) of the metal oxide film 51 on a side far from the substrate 10 is desirably a stable layer whose oxygen content does not change even after application of heat treatment at 120° C. to 200° C., particularly, in an oxygen saturated state. The state in which the oxygen content does not change even after application of heat treatment at 120° C. to 200° C. means that when an oxygen content before application of the heat treatment at 120° C. to 200° C. (first state) and an oxygen content after application of the heat treatment at 120° C. to 200° C. (second state) are compared, the oxygen content in the second state is 95 at % or more of the oxygen content in the first state. In a case where an oxygen-unsaturated layer is provided in the vicinity of an interface with the multilayer reflective film 20, it is possible to form a film having a small reflectance fluctuation after substrate heat treatment and maintaining a high reflectance. A thickness of such an oxide layer is preferably 0.5 nm or more, particularly preferably 1 nm or more, and preferably less than 3.5 nm, particularly preferably 3 nm or less, and further more preferably 2 nm or less.

Figure 3A:
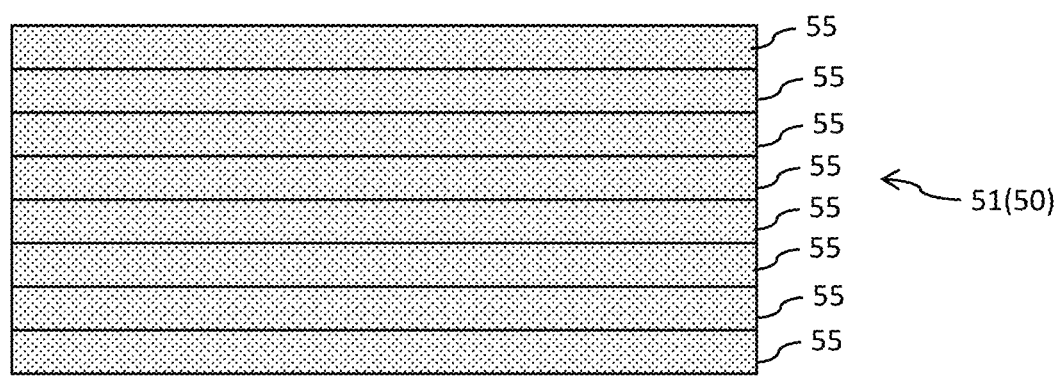
FIG. 3A is a cross-sectional view illustrating an example of a protective film having a multilayer structure used in the embodiment of the present invention.
Figure 3B:
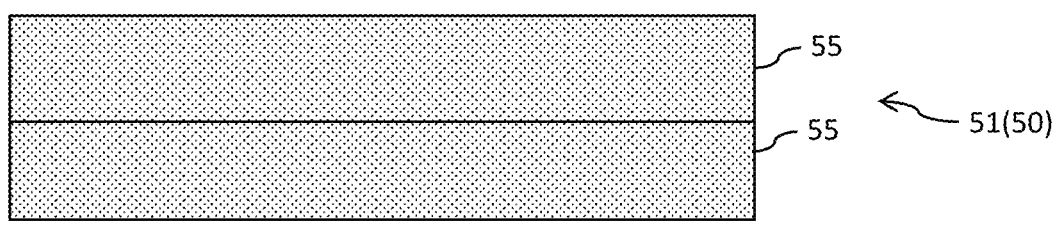
FIG. 3B is a cross-sectional view illustrating another example of a protective film having a multilayer structure used in the embodiment of the present invention.

As illustrated in FIGS. 3A and 3B, the protective film 50 may have a multilayer structure or may be formed by stacking a plurality of metal oxide layers 55. An oxygen content in one metal oxide layer 55 located on a side far from the substrate 10 may be higher than that in another metal oxide layer 55 located on the substrate 10 side. For example, the oxygen content in the metal oxide layer 55 located on the substrate 10 side is equal to or lower than that in the metal oxide layer 55 located on the side far from the substrate 10. As an example, an oxygen content in one metal oxide layer (second metal oxide layer) 55 located on a side far from the substrate 10 is higher than that in at least one metal oxide layer (first metal oxide layer) 55 located on the substrate 10 side.

Figure 4:
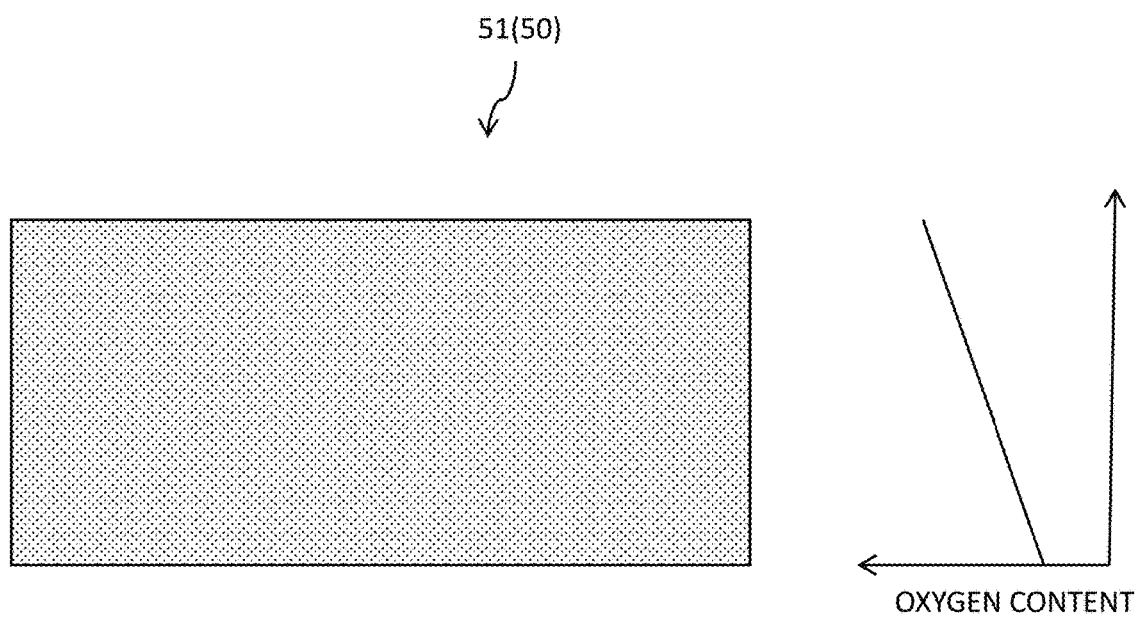
FIG. 4 is a cross-sectional view illustrating an oxygen content in an example of a protective film used in the embodiment of the present invention.
Figure 5:
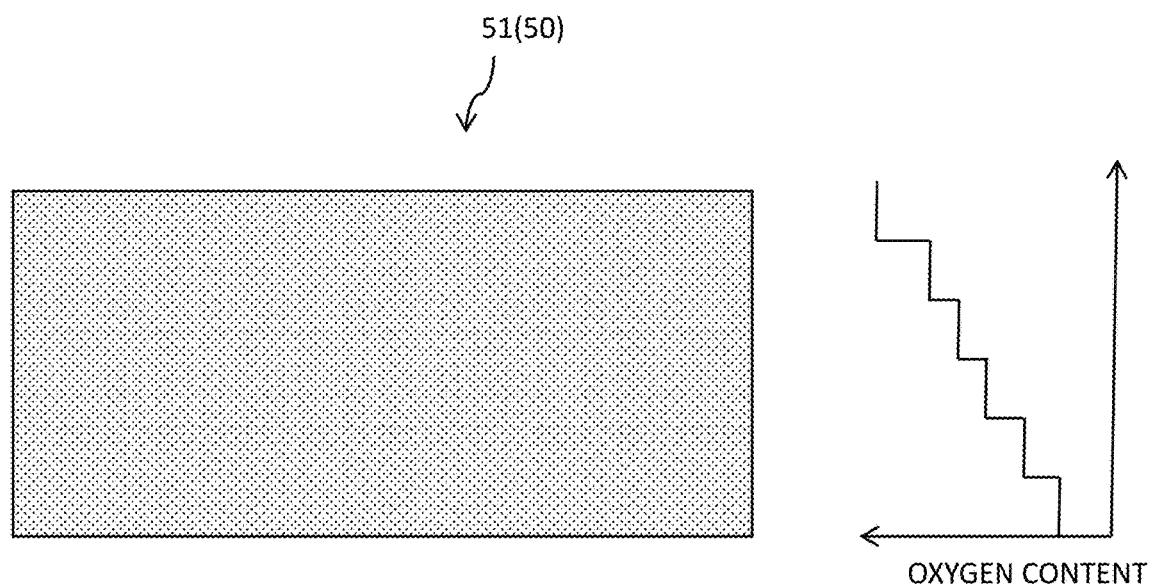
FIG. 5 is a cross-sectional view illustrating an oxygen content in another example of a protective film used in the embodiment of the present invention.

Alternatively, the oxygen content of the protective film 50 may continuously increase as a distance from the substrate 10 increases (see FIG. 4). Alternatively, the oxygen content in the metal oxide layer 55 may increase stepwise as a distance from the substrate 10 increases (see FIG. 5). As an example of the aspect in which the oxygen content in the metal oxide layer 55 increases stepwise as a distance from the substrate 10 increases, an aspect in which the protective film 50 has a multilayer structure as illustrated in FIG. 3A may be adopted. In this case, the oxygen content may increase in increments of 1 at % to 10 at %. As illustrated in FIG. 3B, only two layers of the protective film 50 may be provided, and an oxygen content in the protective film 50 located on the side far from the substrate 10 may be higher than that in the protective film 50 located on the substrate 10 side. A difference in oxygen content in the protective film 50 may be about 15 at % to 50 at %. That is, in a case where the oxygen content in the protective film 50 on a side closest to the substrate 10 is A and the oxygen content in the protective film 50 on a side farthest from the substrate 10 is B, $A \times 1.15 \leq B \leq A \times 1.5$ may be satisfied.

Furthermore, the Si layer 21 (the farthest Si layer 21a) in the multilayer reflective film 20 on the side farthest from the substrate 10 may contain a light element other than oxygen on the metal oxide layer 55 side. Furthermore, an oxidation inhibition layer 60 containing a light element other than oxygen may be provided on the metal oxide layer 55 side between the Si layer 21 (the farthest Si layer 21a) in the multilayer reflective film 20 on the side farthest from the substrate 10 and the protective film 50 (see FIG. 6). The light element is nitrogen, carbon, boron, or the like, and may be a light element other than oxygen. By adopting such an aspect, oxidation of Si in the top layer can be reduced, for example, during formation of the protective film 50 constituted, for example, by the metal oxide film 51, and high reflectance can be maintained. A thickness of the oxidation inhibition layer 60 is preferably 0.2 nm or more and 3 nm or less. The light element in the present embodiment means an element having a weight less than or equal to oxygen. Furthermore, both the oxidation inhibition layer 60 and a buffer layer 140 such as the SiN-containing layer 26 (see FIG. 2) may be provided between the farthest Si layer 21a and the protective film 50 (see FIG. 7).

In the multilayer body constituted by the multilayer reflective film 20 and the protective film 50 on the substrate 10, when first reflectance with respect to the EUV light (13.53 nm) before the heat treatment at 120° C. to 200° C. is compared with second reflectance with respect to the EUV light (13.53 nm) after the heat treatment at 120° C. to 200° C., a change of the second reflectance with respect to the first reflectance may be 0.5% or less.

Figure 9:
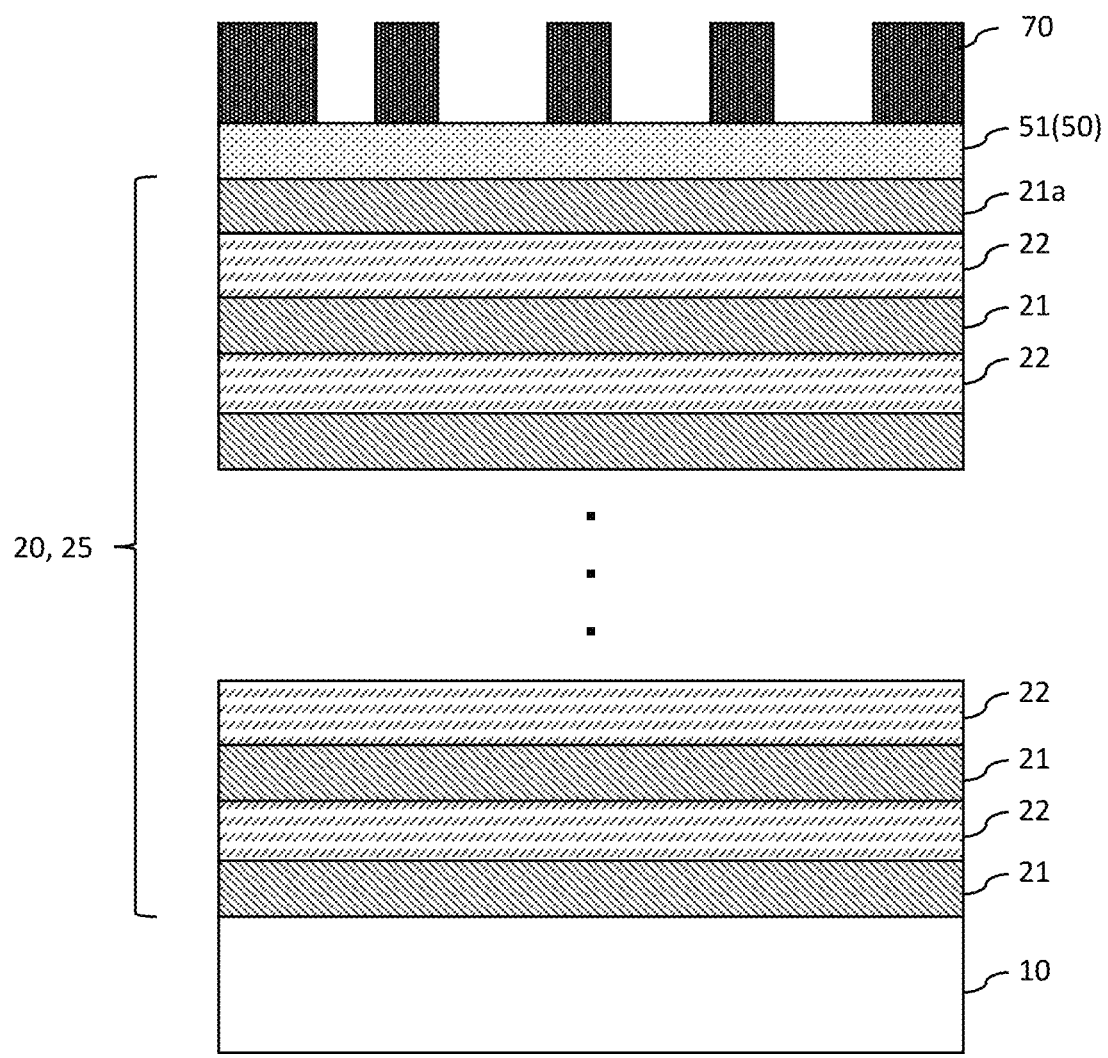
FIG. 9 is a cross-sectional view illustrating an example of a reflective mask according to the embodiment of the present invention.

A reflective mask like the one illustrated in FIG. 9 can be manufactured by using the reflective mask blank according to the present embodiment, and a method for manufacturing a reflective mask is also provided in the present embodiment.

Examples of a method for forming the Si/Mo stacking part 25 include a sputtering method in which power is supplied to a target, an atmospheric gas is converted into plasma (ionized) by the supplied power, and sputtering is performed and an ion beam sputtering method in which a target is irradiated with an ion beam. Examples of the sputtering method include a DC sputtering method in which a DC voltage is applied to a target and an RF sputtering method in which a high-frequency voltage is applied to a target. The sputtering method is a film formation method utilizing a sputtering phenomenon caused by gas ions generated by applying a voltage to a target in a state where a sputtering gas has been introduced into a chamber and ionizing the gas. In particular, a magnetron sputtering method is advantageous in terms of productivity. The power applied to the target may be DC or RF, and DC also includes pulse sputtering that inverts a negative bias applied to the target for a short time to prevent charge-up of the target.

The Si/Mo stacking part 25 can be, for example, formed by a sputtering method using a sputtering apparatus capable of mounting a plurality of targets. Specifically, in a case where the Si layer 21 and the Mo layer 22 are formed by using a silicon (Si) target for forming the Si layer 21 and a molybdenum (Mo) target for forming the Mo layer 22, the Si layer 21 and the Mo layer 22 can be sequentially formed by sequentially sputtering the Si target and the Mo target by using a rare gas such as helium (He) gas, argon (Ar) gas, krypton (Kr) gas, or xenon (Xe) gas as a sputtering gas.

The metal oxide layer 55 can be, for example, formed by ion beam sputtering or magnetron sputtering, as in the case of the multilayer reflective film 20. The metal oxide layer 55 can be formed by sputtering by using a metal material used for the protective film 50 as a target and using, as a sputtering gas, a rare gas such as helium (He) gas, argon (Ar) gas, krypton (Kr) gas, or xenon (Xe) gas and, as necessary, a reactive gas such as an oxygen-containing gas, a nitrogen-containing gas, or a carbon-containing gas.

The EUV mask blank of the present embodiment may have an absorber film 70 that is provided on the protective film 50 and absorbs exposure light. More specifically, an absorber film 70 that absorbs EUV light and reduces reflectance may be provided. The absorber film 70 is preferably provided in contact with the metal oxide layer 55. A conductive film 120 used for electrostatic chuck of the EUV mask to the exposure device may be provided on the other main surface (back surface), which is a surface opposite to the one main surface of the substrate 10, preferably in contact with the other main surface. Although the one main surface of the substrate 10 is the front surface and the upper side and the other main surface is the back surface and the lower side in the present embodiment, these directions (front or back and upper or lower) are ones defined for convenience. One main surface and the other main surface are two main surfaces (film formation surfaces) of the substrate 10, and directions (front or back and upper or lower) thereof are interchangeable.

Figure 7:
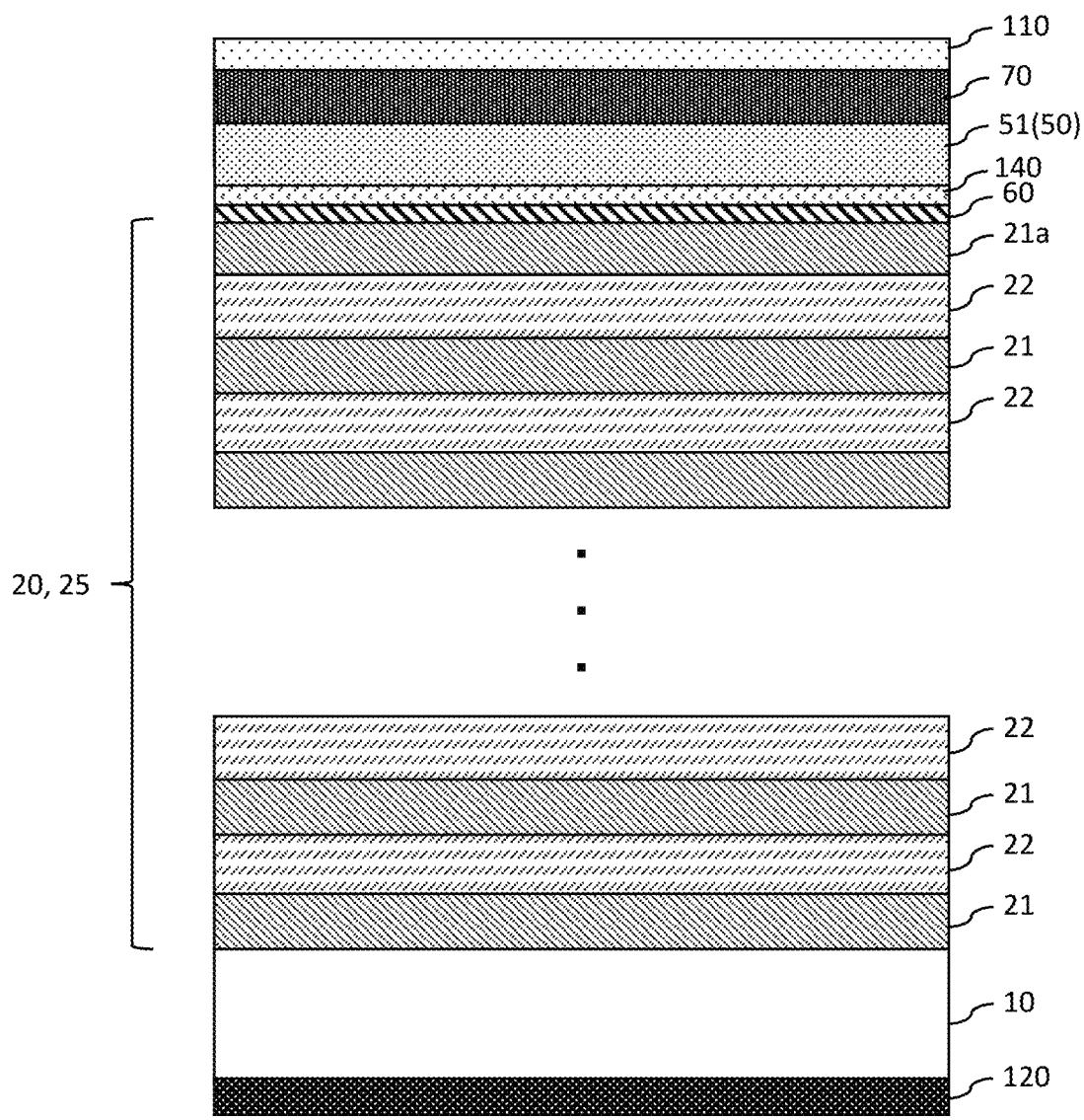
FIG. 7 is a cross-sectional view illustrating an example of a reflective mask blank having an oxidation inhibition layer, a buffer layer, a hard mask film, and a conductive film according to the embodiment of the present invention.

As described above, the buffer layer 140 serving as a base film may be provided between the farthest Si layer 21a and the protective film 50 (see FIG. 7). In a case where the SiN-containing layer 26 is provided between the farthest Si layer 21a of the Si/Mo stacking part 25 and the protective film 50 (the metal oxide film 51), the SiN-containing layer 26 may function as a buffer layer (see FIG. 2). The buffer layer 140 may be made of a metal, such as Ru, that is hardly oxidized, or C, B4C, or the like.

An EUV mask (EUV exposure mask) having an absorber pattern (pattern of the absorber film 70) formed by patterning the absorber film 70 is manufactured from an EUV mask blank (EUV exposure mask blank) (see FIG. 9). The EUV mask blank and the EUV mask are a reflective mask blank and a reflective mask, respectively.

The absorber film 70 is a film that is provided on the multilayer reflective film 20 and absorbs EUV light that is exposure light to reduce reflectance of the exposure light. In the EUV mask, a transfer pattern is formed by a difference in reflectance between a part where the absorber film 70 is formed and a part where the absorber film 70 is not formed.

A material of the absorber film 70 is not limited as long as it is a material that absorbs EUV light and can be patterned. Examples of the material of the absorber film 70 include a material containing tantalum (Ta) or chromium (Cr). The material containing Ta or Cr may contain oxygen (O), nitrogen (N), carbon (C), boron (B), or the like. Examples of the material containing Ta include Ta alone and tantalum compounds such as TaO, TaN, TaON, TaC, TaCN, TaCO, TaCON, TaB, TaOB, TaNB, TaONB, TaCB, TaCNB, TaCOB, and TaCONB. Specific examples of the material containing Cr include Cr alone and chromium compounds such as CrO, CrN, CrON, CrC, CrCN, CrCO, CrCON, CrB, CrOB, CrNB, CrONB, CrCB, CrCNB, CrCOB, and CrCONB.

The absorber film 70 can be formed by sputtering, and the sputtering is preferably magnetron sputtering. Specifically, a metal target such as a chromium (Cr) target or a tantalum (Ta) target, a metal compound target (a target containing a metal such as Cr and Ta and oxygen (O), nitrogen (N), carbon (C), boron (B), or the like) such as a chromium compound target or a tantalum compound target, or the like can be used. Furthermore, a rare gas such as helium (He) gas, argon (Ar) gas, krypton (Kr) gas, or xenon (Xe) gas can also be used as a sputtering gas, and the absorber film 70 can also be formed by reactive sputtering using a reactive gas such as an oxygen-containing gas, a nitrogen-containing gas, or a carbon-containing gas together with a rare gas.

Figure 6:
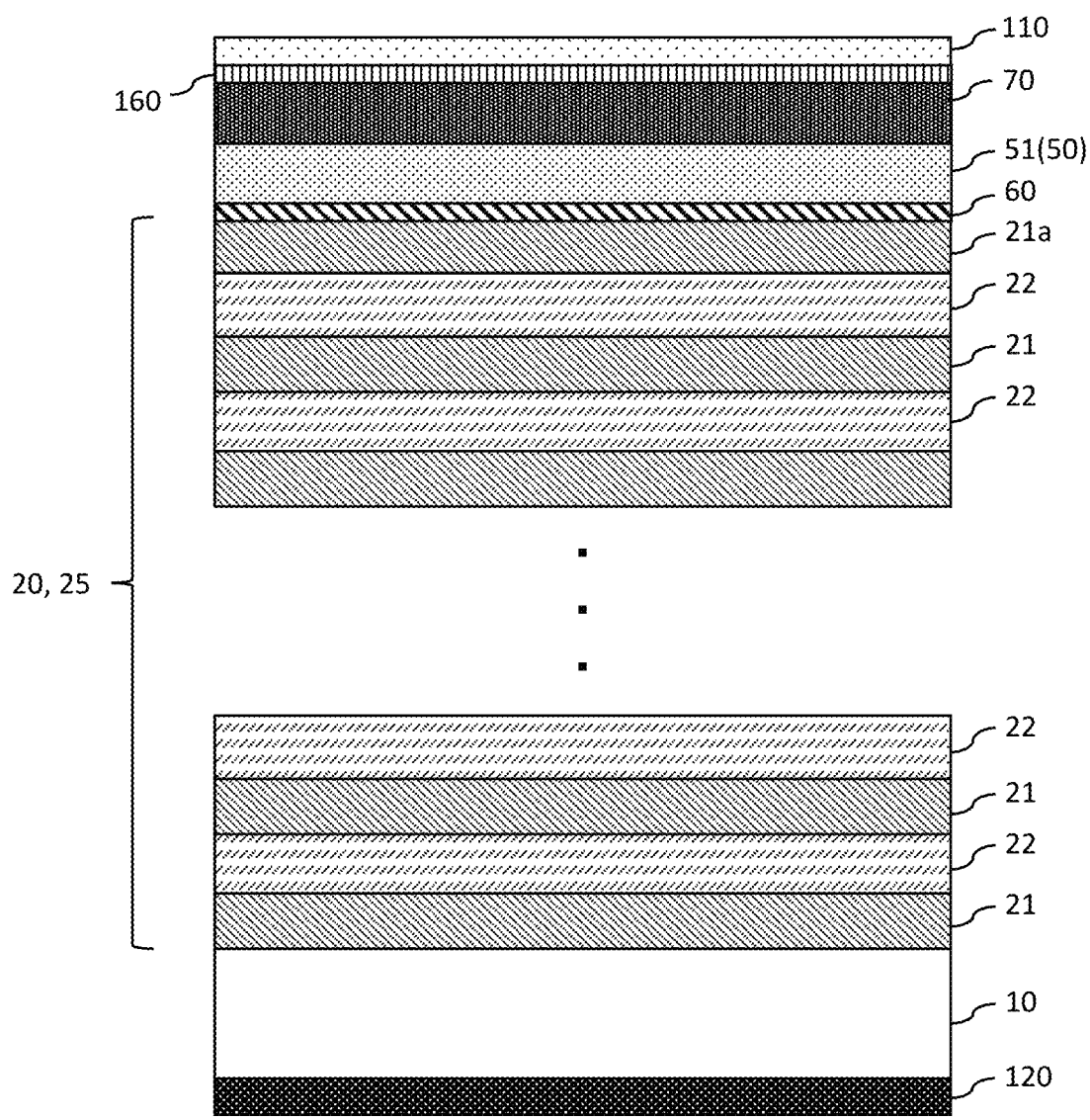
FIG. 6 is a cross-sectional view illustrating an example of a reflective mask blank having an oxidation inhibition layer, a hard mask film, a reflectance reduction layer, and a conductive film according to the embodiment of the present invention.

A hard mask film 110 (an etching mask film of the absorber film 70) having different etching characteristics from those of the absorber film 70 may be provided on a side of the absorber film 70 far from the substrate 10, preferably in contact with the absorber film 70 (see FIGS. 6 and 7). The hard mask film 110 is a film that functions as an etching mask when the absorber film 70 is dry-etched. After formation of an absorber pattern, the hard mask film 110 may be left as a reflectance reduction layer for reducing reflectance at a wavelength of light used in inspection such as pattern inspection to become a part of the absorber film 70 or may be removed so as not to be left on the EUV mask. Examples of a material of the hard mask film 110 include a material containing chromium (Cr). The hard mask film 110 formed of a material containing Cr is suitable especially in a case where the absorber film 70 is formed of a material containing Ta and not containing Cr. A layer (reflectance reduction layer) 160 that mainly bears a function of reducing the reflectance at the wavelength of light used in inspection such as pattern inspection can also be formed on the absorber film 70 (see FIG. 6). In this case, the hard mask film 110 can be formed on the reflectance reduction layer 160. The hard mask film 110 can be, for example, formed by a magnetron sputtering method. A thickness of the hard mask film 110 is not particularly limited, but is typically about 5 nm to 20 nm.

The conductive film 120 provided on the back surface side preferably has a sheet resistance of 100Ω/A or less, and a material thereof is not particularly limited. Examples of the material of the conductive film 120 include a material containing tantalum (Ta) or chromium (Cr). The material containing Ta or Cr may contain oxygen (O), nitrogen (N), carbon (C), boron (B), or the like. Examples of the material containing Ta include Ta alone and tantalum compounds such as TaO, TaN, TaON, TaC, TaCN, TaCO, TaCON, TaB, TaOB, TaNB, TaONB, TaCB, TaCNB, TaCOB, and TaCONB. Specific examples of the material containing Cr include Cr alone and chromium compounds such as CrO, CrN, CrON, CrC, CrCN, CrCO, CrCON, CrB, CrOB, CrNB, CrONB, CrCB, CrCNB, CrCOB, and CrCONB.

The thickness of the conductive film 120 is not particularly limited as long as it functions for an electrostatic chuck, and is typically about 5 nm to 100 nm. The thickness of the conductive film 120 is preferably formed so that film stress is balanced with the multilayer reflective film 20 and the absorber pattern after formation as the EUV mask, that is, after formation of the absorber pattern. The conductive film 120 may be formed before the multilayer reflective film 20 is formed or may be formed after all the films on the multilayer reflective film 20 side of the substrate 10 are formed. Alternatively, the conductive film 120 may be formed after one or some of the films on the multilayer reflective film 20 side of the substrate 10 is formed, and then remaining films on the multilayer reflective film 20 side of the substrate 10 may be formed. The conductive film 120 can be, for example, formed by a magnetron sputtering method.

Figure 8:
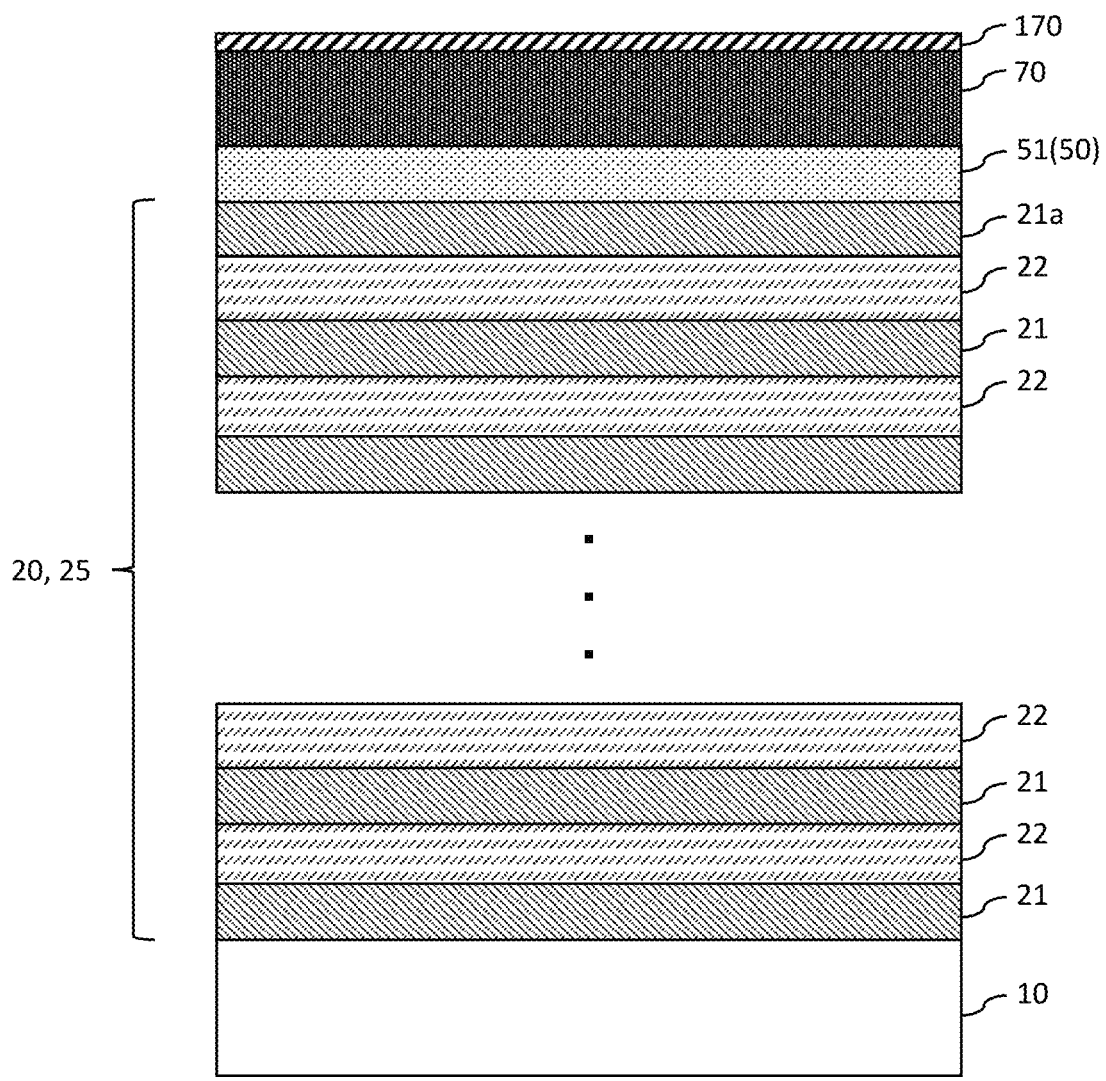
FIG. 8 is a cross-sectional view illustrating an example of a reflective mask blank having a resist film according to the embodiment of the present invention.

Furthermore, the EUV mask blank may have a resist film 170 formed on the side farthest from the substrate 10 (see FIG. 8). The resist film 170 is preferably an electron beam (EB) resist. The resist film 170 may be formed above the hard mask film 110 and the reflectance reduction layer 160 (see FIG. 6).

Pattern drawing and resist pattern formation are performed on the resist film 170 by normal electron beam lithography by using the reflective mask blank, and the absorber film 70 below the resist pattern is removed by etching by using the resist pattern as an etching mask. As a result, an etching removal part and an absorber pattern part including an absorber film pattern and the resist pattern are formed. Thereafter, the remaining resist film pattern is removed to obtain a reflective mask having a basic structure (see FIG. 9).

EXAMPLES

Hereinafter, the present invention will be specifically described with reference to Examples and Comparative Examples, but the present invention is not limited to the following Examples.

Example 1

The multilayer reflective film 20 was formed on the substrate 10 made of quartz glass having a size of 152 mm square and a thickness of 6.35 mm by DC pulse magnetron sputtering using a molybdenum (Mo) target and a silicon (Si) target while rotating the substrate 10 in a manner such that the targets and a main surface of the substrate 10 face each other. The targets were mounted on a sputtering apparatus capable of mounting two targets and discharging one target or both targets at the same time, and the substrate 10 was placed. First, power was applied to the silicon (Si) target while flowing argon (Ar) gas into a chamber to form a silicon (Si) layer having a thickness of 4 nm, and then the application of the power to the silicon (Si) target was stopped. Next, power was applied to the molybdenum (Mo) target while flowing argon (Ar) gas into the chamber to form a molybdenum (Mo) layer having a thickness of 3 nm, and then the application of the power to the molybdenum (Mo) target was stopped. This cycle of operations of forming the silicon (Si) layer and the molybdenum (Mo) was repeated 40 times, and after a 40th cycle molybdenum (Mo) layer was formed, finally a silicon (Si) layer of 3.5 nm was formed by the above method, and then silicon nitride of about 0.5 nm was formed by flowing a nitrogen (N) gas into the chamber. In this way, the multilayer reflective film 20 was formed.

Next, the metal oxide layer 55 that is in contact with the multilayer reflective film 20 was formed on the multilayer reflective film 20 by DC pulse magnetron sputtering using a zirconium (Zr) target and a niobium (Nb) target while rotating the substrate 10 in a manner such that the targets and the main surface of the substrate 10 face each other. After the formation of the multilayer reflective film 20, the substrate 10 on which the multilayer reflective film 20 was formed was placed from the sputtering apparatus that formed the multilayer reflective film 20 through a transport path maintaining a vacuum state without being taken out to the atmosphere. The targets were mounted on another sputtering apparatus capable of mounting two targets and discharging one target or both targets at the same time, and the substrate 10 on which the multilayer reflective film 20 was formed was placed. First, power of 500 W was simultaneously applied to the zirconium (Zr) target and the niobium (Nb) target while flowing argon (Ar) gas at 15 sccm and oxygen ($O_2$) gas at 20 sccm into a chamber to form a layer made of ZrO and NbO and having a thickness of 0.5 nm. Thereafter, a layer made of ZrO and NbO and having a thickness of 1.5 nm and having a high oxygen content was formed by flowing argon (Ar) gas at 12 sccm and oxygen ($O_2$) gas at 50 sccm while keeping the applied power to the targets. In this way, the metal oxide layer 55 was formed.

As for the composition of the protective film 50,
a layer in contact with the multilayer reflective film 20 contains
32 at % zirconium (Zr),
23 at % of niobium (Nb), and
45 at % of oxygen (O).
A layer farthest from the multilayer reflective film 20 (a layer having a high oxygen content) contains
25.5 at % zirconium (Zr),
18.5 at % of niobium (Nb), and
56 at % of oxygen (O).

Reflectance of the multilayer reflective film 20, the protective film 50, and the SiN layer 26 serving as a buffer layer on the substrate 10 with respect to EUV light (wavelength 13 nm to 14 nm) at an incident angle of 6° was measured by an EUV mask fully-automatic reflectometer LPR-1016 (the same applies to the following reflectance measurement) manufactured by euv tech. As a result, the reflectance was 65.0%.

Furthermore, reflectance with respect to EUV light having an incident angle of 6° after the multilayer reflective film 20, the protective film 50, and the SiN layer 26 serving as a buffer layer on the substrate 10 were subjected to heat treatment at 200° C. for 15 minutes in the air atmosphere by a hot plate type heating device was measured. As a result, the reflectance was 65.2%, and a difference between in reflectance before and after the heat treatment was 0.2%. That is, a decrease in the reflectance due to the heat treatment was not observed. Rather, the reflectance improved.

Next, compositions of the multilayer reflective film 20 and the protective film 50 before and after the heat treatment were checked by XPS. As a result, it was confirmed that the oxygen contents of the metal oxide layer 55 and the multilayer reflective film 20 did not change.

Comparative Experimental Example 1

The multilayer reflective film 20 was formed in a similar manner to Experimental Example 1 except that the SiN layer 26 that is a top layer was changed to the Si layer 21 (that is, the SiN layer 26 was not provided). Next, a layer having a thickness of 2.0 nm and containing ZrO and NbO and having a high oxygen content as in Example 1 was formed by simultaneously applying power of 500 W to a zirconium (Zr) target and a niobium (Nb) target while flowing argon (Ar) gas at 12 sccm and oxygen ($O_2$) gas at 50 sccm into a chamber in a similar manner to Example 1, and a layer having a low oxygen content was not provided between the layer and the multilayer film.

Reflectance of the multilayer reflective film 20 and the protective film 50 on the substrate 10 with respect to EUV light (wavelength 13 nm to 14 nm) at an incident angle of 6° was measured by an EUV mask fully-automatic reflectometer LPR-1016 (the same applies to the following reflectance measurement) manufactured by euv tech. As a result, the reflectance was 63.8%.

Furthermore, reflectance with respect to EUV light having an incident angle of 6° after the multilayer reflective film 20 and the protective film 50 (the buffer layer and the metal oxide layer 55) on the substrate 10 were subjected to heat treatment at 200° C. for 15 minutes in the air atmosphere by a hot plate type heating device was measured. As a result, the reflectance was 63.8%, and a difference between in reflectance before and after the heat treatment was 0.0%. That is, a decrease in the reflectance due to the heat treatment was not observed.

Next, compositions of the multilayer reflective film 20 and the protective film 50 before and after the heat treatment were checked by XPS. As a result, it was confirmed that the oxygen contents in the metal oxide layer 55 and the multilayer reflective film 20 did not change, but an oxygen content in the Si layer 21 provided on the front surface of the multilayer reflective film 20 was as high as 35 at % as compared with Example 1. This may undesirably cause a decrease in reflectance.

Comparative Example 1

The multilayer reflective film 20 was formed in a similar manner to Experimental Example 1 except that the SiN layer that is a top layer was changed to the Si layer (that is, the SiN layer 26 was not provided). Next, a protective film in contact with the multilayer reflective film 20 was formed on the multilayer reflective film 20 by DC pulse magnetron sputtering using a ruthenium (Ru) target while rotating the substrate 10. After the formation of the multilayer reflective film 20, the substrate 10 on which the multilayer reflective film 20 was formed was placed from the sputtering apparatus that formed the multilayer reflective film 20 through a transport path maintaining a vacuum state without being taken out to the atmosphere. Power was applied to the Ru target while flowing argon (Ar) gas into a chamber to form a Ru layer having a thickness of 2.0 nm as the protective film 50. Reflectance of the multilayer reflective film 20 and the protective film 50 on the substrate 10 with respect to EUV light (wavelength 13 nm to 14 nm) having an incident angle of 6° was measured. As a result, the reflectance was 65.3%.

Furthermore, reflectance with respect to EUV light having an incident angle of 6° after the multilayer reflective film 20 and the protective film 50 on the substrate 10 were subjected to heat treatment at 200° C. for 15 minutes in the air atmosphere by a hot plate type heating device was measured. As a result, the reflectance was 59.4%, and a difference between in reflectance before and after the heat treatment was 5.9%.

Next, compositions of the multilayer reflective film 20 and the protective film 50 before and after the heat treatment were checked by XPS. As a result, formation of a diffusion layer of Ru and Si and progress of oxidation of the surface layer of the multilayer reflective film 20 were confirmed.

Comparative Example 2

The multilayer reflective film 20 was formed in a similar manner to Experimental Example 1 except that the Mo layer 22 having a thickness of 0.5 nm was formed in place of the SiN layer as the top layer. In this case, the Mo layer 22 constitutes the multilayer reflective film 20, and the Mo layer 22 is provided in the topmost surface of the multilayer reflective film 20. Next, a protective film in contact with the multilayer reflective film 20 was formed on the multilayer reflective film 20 by DC pulse magnetron sputtering using a ruthenium (Ru) target while rotating the substrate 10. After the formation of the multilayer reflective film 20, the substrate 10 on which the multilayer reflective film 20 was formed was placed from the sputtering apparatus that formed the multilayer reflective film 20 through a transport path maintaining a vacuum state without being taken out to the atmosphere. Power was applied to the Ru target while flowing argon (Ar) gas into a chamber to form a Ru layer having a thickness of 2.5 nm as the protective film 50.

Reflectance of the multilayer reflective film 20 and the protective film 50 on the substrate 10 with respect to EUV light (wavelength 13 nm to 14 nm) having an incident angle of 6° was measured. As a result, the reflectance was 65.4%.

Furthermore, reflectance with respect to EUV light having an incident angle of 6° after the multilayer reflective film 20 and the protective film 50 on the substrate 10 were subjected to heat treatment at 200° C. for 15 minutes in the air atmosphere by a hot plate type heating device was measured. As a result, the reflectance was 62.9%, and a difference between in reflectance before and after the heat treatment was 2.5%.

Next, compositions of the multilayer reflective film 20 and the protective film 50 before and after the heat treatment were checked by XPS. As a result, formation of a diffusion layer of Ru and Si was suppressed by the Mo layer 22, but progress of oxidation of the Mo layer 22 was confirmed.

Comparative Example 3

The multilayer reflective film 20 was formed in a similar manner to Comparative Example 2. In this case, the Mo layer 22 is provided in the topmost surface of the multilayer reflective film 20, as described above. Next, a layer made of ZrO and NbO and having a thickness of 2.0 nm and having a high oxygen content as in Example 1 was formed, as in Comparative Experimental Example 1.

Reflectance of the multilayer reflective film 20 and the protective film 50 on the substrate 10 with respect to EUV light (wavelength 13 nm to 14 nm) having an incident angle of 6° was measured. As a result, the reflectance was 57.2%. Furthermore, reflectance with respect to EUV light having an incident angle of 6° after the multilayer reflective film 20 and the protective film 50 on the substrate 10 were subjected to heat treatment at 200° C. for 15 minutes in the air atmosphere by a hot plate type heating device was measured. As a result, the reflectance was 56.8%, and a difference between in reflectance before and after the heat treatment was 0.4%.

Although a decrease in reflectance after the heat treatment can be reduced even in Comparative Example 3, in which the metal oxide films 51 having different oxygen contents are provided and the Mo layer is provided in the topmost surface, the absolute value of the reflectance is a small value. On the other hand, Example 1 is advantageous in that even in a case where the metal oxide films 51 having different oxygen contents are provided, high reflectance can be realized while reducing a decrease in reflectance after the heat treatment by disposing not an Mo layer but an Si layer in the topmost layer.

REFERENCE SIGNS LIST 10 substrate
20 multilayer reflective film
25 Si/Mo stacking part
50 protective film
51 metal oxide film
55 metal oxide layer
70 absorber film

The invention claimed is:

1. A reflective mask blank comprising:
   a substrate;
   a multilayer reflective film that is provided on the substrate and configured to reflect exposure light;
   a SiN layer that consists of Si and N, that is provided on the multilayer reflective film and contacts the multilayer reflective film, wherein the SiN layer has a thickness from 0.1 nm to 2 nm,
   a metal oxide film that is provided on the SiN layer and contacts the SiN layer, wherein the metal oxide film contains at least one of Zr, Nb, Ti, and Y; and
   an absorber film including Ta or Cr that is provided on the metal oxide film and contacts the metal oxide film, and that is configured to absorb exposure light,
   wherein the multilayer reflective film is configured such that a Mo layer and a Si layer are alternately stacked and a layer on a side farthest from the substrate is the Si layer, and
   wherein the metal oxide film is configured such that an oxygen content in a layer on a side far from the substrate is higher than the oxygen content in a layer on a substrate side, and
   wherein the oxygen content in the metal oxide film continuously increases as a distance from the substrate increases, and the metal oxide film does not comprise Ru.

2. The reflective mask blank according to claim 1, wherein a metal contained in the metal oxide film is a metal whose extinction coefficient k for EUV light having a wavelength of 13.53 nm is less than 0.02.

3. The reflective mask blank according to claim 1, wherein the metal oxide film functions as an etching stopper while the absorber film is being processed.

4. The reflective mask blank according to claim 1, wherein the oxygen content in the layer of the metal oxide film on the side far from the substrate does not change by heat treatment at 120° C. to 200° C.

5. The reflective mask blank according to claim 1, wherein a thickness of the metal oxide film is 0.5 nm or more and less than 3.5 nm.

6. The reflective mask blank according to claim 1, wherein the Si layer of the multilayer reflective film on a side farthest from the substrate contains a light element other than oxygen on a metal oxide film side.

7. The reflective mask blank according to claim 6, wherein the light element is one or more of nitrogen, carbon, and boron.

8. The reflective mask blank according to claim 1, wherein in a case where first reflectance with respect to EUV light having a wavelength of 13.53 nm before heat treatment at 120° C. to 200° C. and second reflectance with respect to the EUV light having a wavelength of 13.53 nm after the heat treatment at 120° C. to 200° C. are compared, a change of the second reflectance with respect to the first reflectance is 0.5% or less.

9. A reflective mask blank comprising:
   a substrate;
   a multilayer reflective film that is provided on the substrate and configured to reflect exposure light;
   an oxidation inhibition layer that is provided on the multilayer reflective film and contacts the multilayer reflective film, wherein the oxidation inhibition layer containing a light element and has a thickness from 0.2 nm to 3 nm, and wherein the light element is one or more of nitrogen, carbon, and boron;
a SiN layer that consists of Si and N, that is provided on the oxidation inhibition layer and contacts the oxidation inhibition layer, wherein the SiN layer has a thickness from 0.1 nm to 2 nm;
a metal oxide film that is provided on the SiN layer and contacts the SiN layer, wherein the metal oxide film consists of Zr, Nb and O; and
an absorber film including Ta or Cr that is provided on the metal oxide film and contacts the metal oxide film, and that is configured to absorb exposure light,
wherein the multilayer reflective film is configured such that a Mo layer and a Si layer are alternately stacked and a layer on a side farthest from the substrate is the Si layer, and
wherein the metal oxide film is configured such that an oxygen content in a layer on a side far from the substrate is higher than the oxygen content in a layer on a substrate side, and
wherein the metal oxide film has a multilayer structure and is configured such that an oxygen content in a second layer located on the side far from the substrate is higher than an oxygen content in a first layer located on the substrate side, and the metal oxide film does not comprise Ru.

* * * * *